US011462444B2

(12) United States Patent
Nagaike

(10) Patent No.: US 11,462,444 B2
(45) Date of Patent: Oct. 4, 2022

(54) SUBSTRATE CONTAINER, CONTROLLER, AND ABNORMALITY DETECTION METHOD

(71) Applicant: Tokyo Electron Limited, Tokyo (JP)

(72) Inventor: Hiroshi Nagaike, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 57 days.

(21) Appl. No.: 16/001,294

(22) Filed: Jun. 6, 2018

(65) Prior Publication Data

US 2018/0358249 A1    Dec. 13, 2018

(30) Foreign Application Priority Data

Jun. 8, 2017 (JP) .............................. JP2017-113770

(51) Int. Cl.
*H01L 21/66* (2006.01)
*H01L 21/67* (2006.01)
(Continued)

(52) U.S. Cl.
CPC ........ *H01L 22/10* (2013.01); *H01L 21/67242* (2013.01); *H01L 21/67253* (2013.01); *H01L 21/67288* (2013.01); *H01L 21/67383* (2013.01); *H01L 21/67389* (2013.01); *H01L 21/67393* (2013.01); *H01L 21/67769* (2013.01); *H01L 21/67772* (2013.01)

(58) Field of Classification Search
CPC .... G01N 21/8422; G01N 21/88; G01N 21/90; G01N 21/94; G01N 21/95; G01N 21/9501; G01N 2021/8461; G01N 2030/8872; G01N 2223/652; H01L 21/67288; H01L 21/67389; H01L 21/67769; H01L 21/67383; H01L 21/67253; H01L 21/67772; H01L 21/67393; H01L 22/10; H01L 21/67242
USPC ................................................. 73/23.2, 31.03
See application file for complete search history.

(56) References Cited

U.S. PATENT DOCUMENTS

| 5,151,110 | A | * | 9/1992 | Bein ....................... B01D 53/02 95/140 |
| 6,156,578 | A | * | 12/2000 | Tom .......................... G01G 3/13 422/62 |

(Continued)

FOREIGN PATENT DOCUMENTS

| JP | 2002-168748 | 6/2002 |
| JP | 2004-047929 | 2/2004 |

(Continued)

OTHER PUBLICATIONS

"Periodic Table: Metalloids"—http://www.chemicalelements.com/groups/metalloids.html (Year: 2012).*

(Continued)

*Primary Examiner* — Benjamin R Schmitt
(74) *Attorney, Agent, or Firm* — IPUSA, PLLC

(57) ABSTRACT

A substrate accommodating container that accommodates a substrate includes a monitor installed inside the substrate accommodating container so as to detect a contamination state inside the substrate accommodating container, wherein the contamination state inside the substrate accommodating container is detected.

20 Claims, 10 Drawing Sheets

(51) Int. Cl.
  *H01L 21/673*  (2006.01)
  *H01L 21/677*  (2006.01)

(56) References Cited

U.S. PATENT DOCUMENTS

| | | | | |
|---|---|---|---|---|
| 2004/0175880 | A1* | 9/2004 | Tanaka | H01L 21/67028 438/209 |
| 2006/0228657 | A1* | 10/2006 | Masters | G01N 29/036 430/495.1 |
| 2009/0027634 | A1* | 1/2009 | Nishimura | G03F 7/70525 355/27 |
| 2009/0317214 | A1* | 12/2009 | Hsiao | H01L 21/67017 414/217 |
| 2011/0220545 | A1* | 9/2011 | Ra | H01L 21/67376 206/711 |

FOREIGN PATENT DOCUMENTS

| | | |
|---|---|---|
| JP | 2012-094822 | 5/2012 |
| JP | 2013-179287 | 9/2013 |
| JP | 2017-17154 | 1/2017 |

OTHER PUBLICATIONS

"Periodic Table: Non-Metals"—http://www.chemicalelements.com/groups/nonmetals.html (Year: 2012).*

"Silicon"—http://www.chemistryexplained.com/elements/P-T/Silicon.html (Year: 2016).*

* cited by examiner

FIG.11

| PROCESSING CONDITION TABLE | |
|---|---|
| PURGE TIME | △△ TIME |
| PURGE STORAGE HOLDING TIME | ×× TIME |
| ASHING TIME | ○○ TIME |
| ADDING ASHING | YES/NO |
| ADDING DC | YES/NO |
| DC TIME | × TIME |
| WAFER HEATING TEMPERATURE | △°C |
| SURFACE TREATMENT IN CLEANING APPARATUS | YES/NO |

SUBSTRATE CONTAINER, CONTROLLER, AND ABNORMALITY DETECTION METHOD

CROSS-REFERENCE TO RELATED APPLICATIONS

This patent application is based upon and claims the benefit of priority of Japanese Patent Application No. 2017-113770 filed on Jun. 8, 2017, the entire contents of which are incorporated herein by reference.

BACKGROUND OF THE INVENTION

1. Field of the Invention

The present invention relates to a substrate accommodating container, a control device, and an abnormality detection method.

2. Description of the Related Art

One example of semiconductor manufacturing processes is provided to accommodate multiple wafers in multiple stages of a substrate accommodating container and deliver the substrate accommodating container having the multiple wafers. The substrate accommodating container includes a Front Opening Unified Pod (FOUP).

The FOUP is mounted in a load port (LP). The wafer is carried out of FOUP at a predetermined timing and processed in a substrate processing chamber (process module: PM) installed in the substrate processing apparatus. Thereafter, the wafer is returned to the FOUP. Therefore, a wafer after processing (hereinafter, referred to as a post-process wafer) and a wafer before processing (hereinafter, referred to as a pre-process wafer) may be mixed in the FOUP.

On the surface of the wafer subjected to an etching process, a process gas may be adsorbed, a gas may remain without sufficient etching reaction, and an object to be etched may attach. These remaining objects change the surface state of the post-process wafer little by little by reacting with moisture in the atmosphere or gradually desorbing as an outgas. As a result, the pre-process wafer may alter, a defect may occur in a device formed on the post-process wafer, a device property may change.

In many cases, the wafer is badly influenced with the passage of time. Therefore, time management (i.e., Q-Time) is conducted after the wafer is processed, and the wafer which has not been processed within a regular time is disposed. Then, in order to extend the regular time, the inside of the FOUP, in which the post-process wafer is accommodated, is replaced by an inactive gas such as a $N_2$ gas (for example, Patent Document 1).

[Patent Document 1] Japanese Laid-open Patent Publication No. 2013-179287

[Patent Document 2] Japanese Laid-open Patent Publication No. 2017-17154

SUMMARY OF THE INVENTION

A substrate accommodating container that accommodates a substrate including a monitor installed inside the substrate accommodating container so as to detect a contamination state inside the substrate accommodating container, wherein the contamination state inside the substrate accommodating container is detected.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

BRIEF DESCRIPTION OF THE DRAWINGS

FIG. 11 illustrates an example of a processing condition table of the embodiment.

DETAILED DESCRIPTION OF EMBODIMENTS

Figure 1:
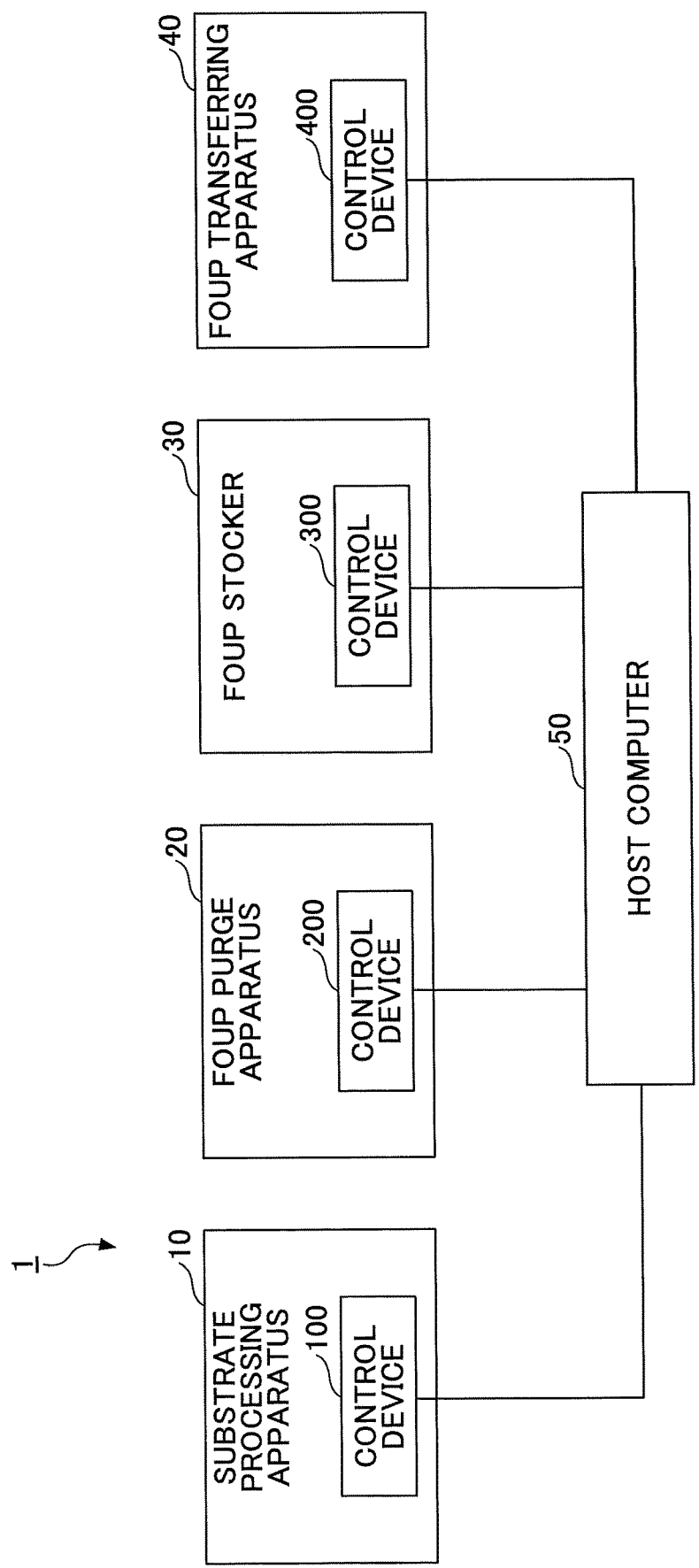
FIG. 1 illustrates an example of a schematic structure of a substrate processing system of an embodiment.

Patent Document 1 supplies an inactive gas at a predetermined flow rate for a predetermined purge time without detecting a contamination state inside a substrate accommodating container. Therefore, there are problems that purge by the inactive gas is excessive or insufficient.

Here, one embodiment of the present invention is provided to detect the contamination state inside the substrate accommodating container.

A description of embodiments of the present invention is given below, with reference to the FIG. 1 through FIG. 13.

The embodiments described below are only examples and the present invention is not limited to the embodiments.

Through all figures illustrating the embodiments, the same references symbols are used for portions having the same function, and repetitive explanations of these portions are omitted.

Reference symbols typically designate as follows:
10: substrate processing apparatus
20: FOUP purge apparatus
30: FOUP stocker
50: host computer
60: FOUP
70: QCM
100: control device 200: control device
300: control device
400: control device
PM: substrate processing chamber
PS: purge storage

[Overall Structure of Substrate Processing System]

Referring to FIG. 1, an example of a schematic structure of a substrate processing system 1 of one embodiment of the present invention is described.

Referring to FIG. 1, the substrate processing system 1 includes a substrate processing apparatus 10, a FOUP purge apparatus 20, a FOUP stocker 30, a FOUP transferring apparatus 40, and a host computer 50. The numbers of the substrate processing apparatuses 10, the FOUP purge apparatuses 20, the FOUP stockers 30, and the FOUP transferring apparatuses 40 are not limited to the numbers of the same illustrated in the figures.

The substrate processing apparatus 10 is controlled by a control device 100 to provide a semiconductor wafer (hereinafter, referred to as a "wafer") processes such as an etching process, a deposition process, a cleaning process, and an ashing process. Detailed structure and operation of the substrate processing apparatus 10 are described later.

The FOUP purge apparatus 20 is controlled by a control device 200 to purge the inside of the FOUP, in which the FOUP purge apparatus 20 is installed, with an inactive gas such as a $N_2$ gas. The FOUP purge apparatus 20 is a dedicated purge apparatus, which is formed separate from the substrate processing apparatus 10 and can purge the inside of the FOUP. A detailed structure of the FOUP purge apparatus 20 is similar to a load port (described below) installed inside the substrate processing apparatus 10.

The FOUP stocker 30 is a vault temporarily storing the FOUP, which accommodates one or multiple wafers. The FOUP stocker 30 has a function of purging the inside of the FOUP in a manner similar to the FOUP purge apparatus 20. The FOUP stocker 30 is controlled by the control device 300 to purge the inside of the FOUP, in which the FOUP is installed, by a purge function using the $N_2$ gas, for example.

The FOUP transferring apparatus 40 is controlled by a control device 400 to transfer the FOUP among the substrate processing apparatus 10, the FOUP purge apparatus 20, and the FOUP stocker 30.

The host computer 50 is coupled to the control devices 100, 200, 300, and 400 to manage manufacturing processes of a factory, in which the substrate processing system 1 is installed in cooperation with the control devices 100, 200, 300, and 400. The control devices 100, 200, 300, and 400 may be structured by a module controller or an equipment controller.

The control devices 100, 200, 300, and 400 and the host computer 50 is an example of the control device controlling the substrate processing system 1, which includes the substrate processing apparatus 10 processing the substrate in a substrate processing chamber of the embodiment using a predetermined gas.

[Structure of Substrate Processing Apparatus]

Figure 2:
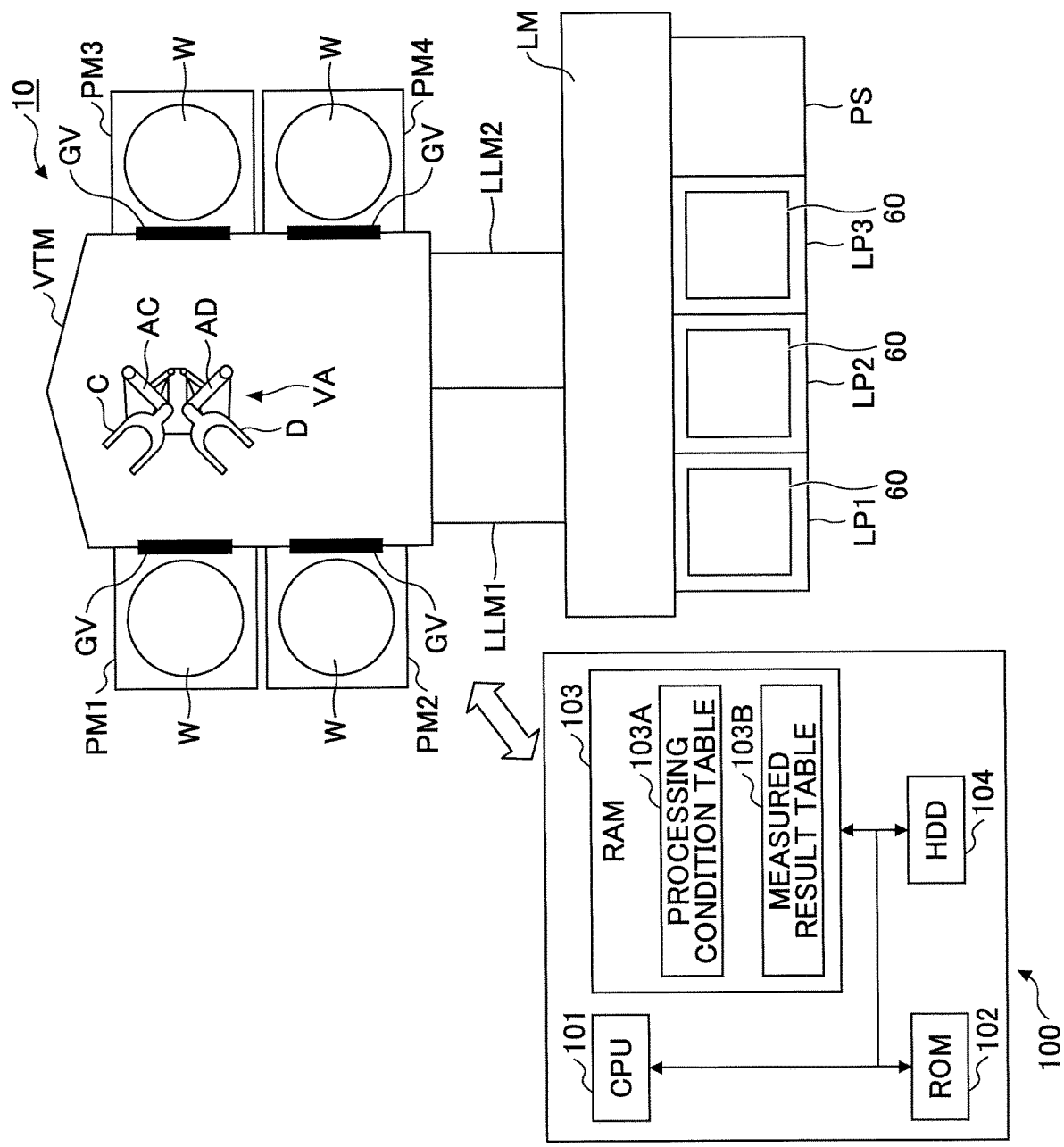
FIG. 2 illustrates an example of a structure of a substrate processing apparatus of the embodiment.

Referring to FIG. 2, an example of a structure of a substrate processing apparatus 10 of one embodiment of the present invention is described. The substrate processing apparatus 10 is an apparatus having a cluster structure (multi-chamber type).

Referring to FIG. 2, the substrate processing apparatus 10 includes substrate processing chambers process modules (PM1 to PM4), a transfer chamber as a vacuum transfer module (VTM), load locking chamber as a load lock modules (LLM1 and LLM2), a loader module (LM), load ports (LP1 to LP3), and a purge storage (PS). In the substrate processing chambers PM1 to PM4, a predetermined process is provided to the wafer W.

The substrate processing chambers PM1 to PM 4 are arranged adjacent to the transfer chamber VTM. The substrate processing chambers PM1 to PM4 are collectively referred to as a substrate processing chamber PM. The substrate processing chambers PM1 to PM4 communicate with the transfer chamber VTM by opening a gate valve GV, which can be opened and closed. The substrate processing chambers PM1 to PM4 are depressurized to be a predetermined vacuum atmosphere. Inside the substrate processing chamber, a process such as an etching process, a deposition process, a cleaning process, an ashing process, or the like is provided.

A transfer device VA transferring the wafer W is arranged inside the transfer chamber VTM. The transfer device VA includes two robot arms AC and AD which are freely capable of bending and stretching and rotatable. Picks C and D are respectively attached to tip ends of the robot arms AC and AD. The transfer device VA can hold the wafer W respectively by the picks C and D. The wafers W can be carried in and out from the transfer chamber VTM to the substrate processing chambers PM1 to PM4 in response to opening and closing of the gate valve GV. The transfer device VA carries the wafer W in and out the load locking chambers LLM1 and LLM2.

The load locking chambers LLM1 and LLM2 are provided between the transfer chamber VTM and the loader module LM. The load locking chambers LLM1 and LLM2 switch over the air atmosphere and the vacuum atmosphere and transfer the wafer W from the loader module LM on the air atmosphere side to the transfer chamber VTM on the vacuum atmosphere side or from the transfer chamber VTM on the vacuum atmosphere side to the loader module LM on the air atmosphere side.

Load ports LP1 to LP3 are provided on the sidewall of a long side of the loader module LM. For example, the FOUP accommodating 25 pieces of wafers or a vacant FOUP are mounted on the load ports LP1 to LP3. The loader module LM carries the wafer W carried out of the FOUP inside the load ports LP1 to LP3 in either one of the load locking chambers LLM1 and LLM2. Further, the loader module LM carries the wafer W carried out of either one of the load locking chambers LLM1 and LLM2 in the FOUP.

A purge storage PS is provided on the sidewall of the long side of the loader module LM together with the load ports LP1 to LP3. The wafer processed by the loader module LM is carried in the purge storage PS so as to be temporarily stored in the air atmosphere and provided with $N_2$ purge. This temporarily stored wafer W is carried in the FOUP in the load ports LP1 to LP3 by the loader module LM.

The control device 100 controlling the substrate processing apparatus 10 includes a central processing unit (CPU) 101 as an example of the control unit, a read only memory (ROM) 102, a random access memory (RAM) 103, and a hard disk drive (HDD) 104. The control device 100 may include another memory area such as a solid state drive (SSD) in addition to the HDD 104. The memory area such as the HDD 104 and the RAM 103 stores a recipe, in which the procedure of a process, the condition of the process, and a delivery condition are set. Hereinafter, the CPU 101 may be referred to as the control unit 101.

The CPU 101 controls processing of the wafer W in each substrate processing chamber PM in accordance with the recipe and also controls transfer of the wafer W. A program for executing a substrate transfer process or a cleaning process (described later) may be stored in the HDD 104 and the RAM 103. The program for executing the substrate transfer process or the cleaning process may be stored in a memory medium so as to be supplied or may be supplied from an external apparatus.

A processing condition table 103A indicating the condition of substrate processing and a measured result table 103B accumulating the measured result of the QCM are stored in the RAM 103. The processing condition table 103A and the measured result table 103B are described later.

The control devices 200, 300, and 400 and the host computer 50 may have similar structures.

The numbers of the substrate processing chamber PM, the transfer chamber VTM, the load locking chamber LLM, the loader module LM, the load port LP, and the purge storage PS are not limited to those described in the embodiment and may be any number. As described later, the FOUP is mounted on the load port LP, and a monitor is installed inside the FOUP. At least one monitor is installed inside the FOUP.

[Structure of Load Port and FOUP]

Figure 3:
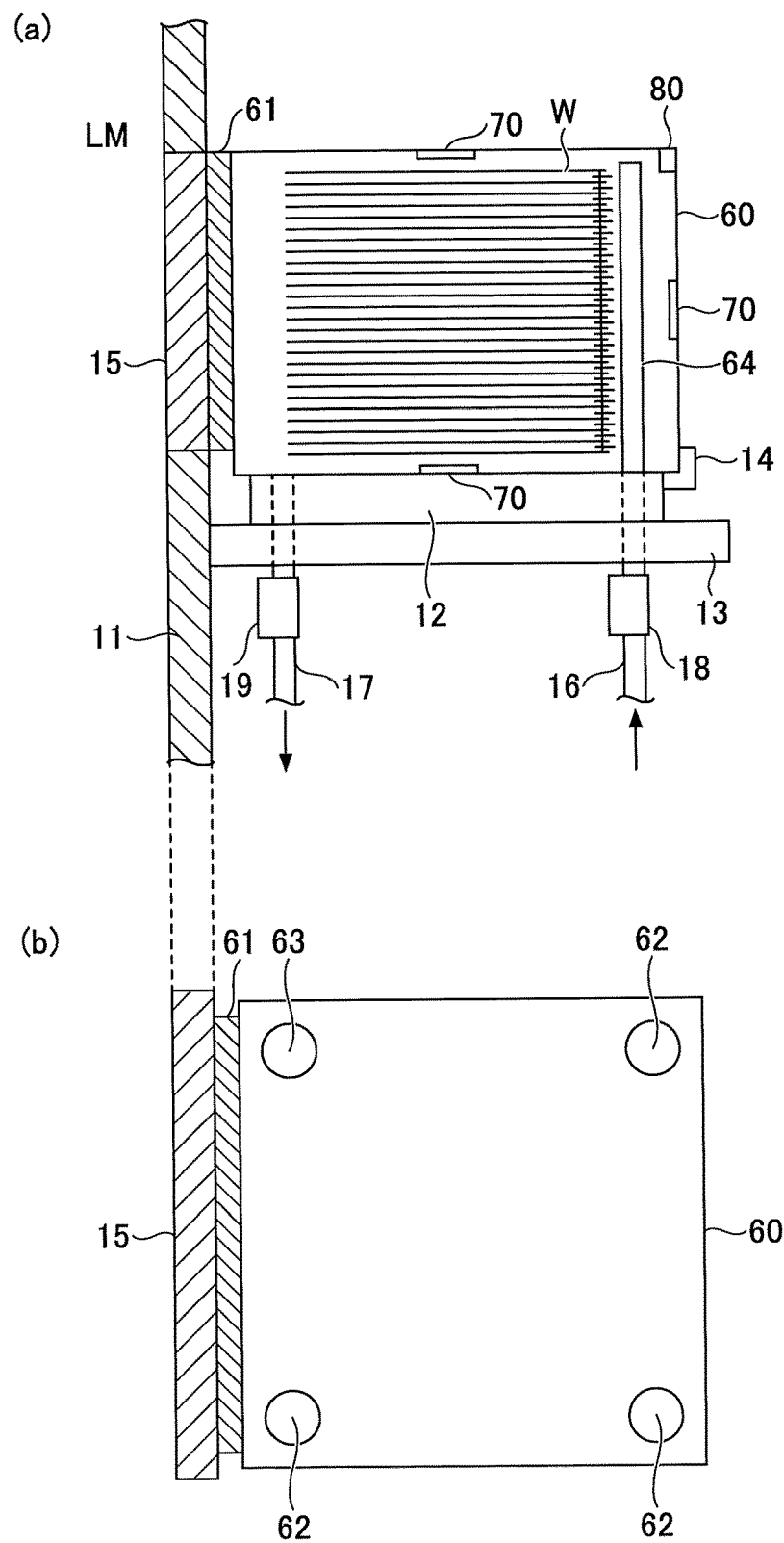
FIG. 3 illustrates an example of a structure of a load port and a FOUP of the embodiment.

Referring to FIG. 3, an example of the structure of the load port LP and the FOUP 60 is described. FIG. 3 illustrates a state where the FOUP 60 is mounted on the load port LP. Further, the load port LP conducts purging inside the FOUP 60 in response to an instruction from the control device 100.

Referring to FIG. 3, at (a), the FOUP 60 is shaped like a box having a lid 61 hermetically closing an opening of the box opened in a forward direction. The lower surface of the FOUP 60 is supported by the mounting stage 12 of the load port LP, which is provided on the outside of the partition wall 11 forming the loader module LM. The FOUP 60 is transferred from an outside of the substrate processing apparatus 10 by the FOUP transferring apparatus 40 and is mounted on the upper surface of the mounting stage 12. Inside the loader module LM, a gas flow directing from the upper side to the lower side, namely a down flow, is formed.

The mounting stage 12 is supported by a supporting member 13 provided outside surface of the partition wall 11. A clamping member 14 is provided on a back side of the mounting stage 12 and clamps the mounting stage 12 with the FOUP 60 at a predetermined position.

A port door 15 is provided at a position facing the lid 61 of the partition wall 11.

The port door 15 is freely opened and closed. Therefore, the lid 61 can be opened or closed by opening or closing the port door 15 while the port door 15 contacts the lid 61.

The wafers W equal to, for example, 25 are horizontally arranged at an even interval in multistage inside the FOUP 60.

A quartz crystal microbalance (QCM) 70 is provided inside the FOUP 60. The QCM 70 is an example of a monitor that can detects a contamination state.

The QCM 70 may be provided on an upper surface, a lower surface, or a side surface of the FOUP 60. Here, it is preferable to attach the QCM 70 at a location where a gas stays in response to the type (weight) of a predetermined gas used to process the wafer W in the substrate processing chamber PM. With this, the contamination state can be highly accurately detected. Further, multiple QCMs 70 may be provided inside the FOUP 60

A transmitter 80 sending the measured result by the QCM 70 is provided inside the FOUP 60. Further, a power source is built in the transmitter 80. The drive power of the QCM 70 may be supplied from a connector (not illustrated) provided in the mounting stage on which the FOUP 60 is mounted or may be supplied from the power source built in the QCM 70.

The measured result of the QCM 70 is output to the control device 100 through a connector (not illustrated) provided in the mounting stage 12, on which the FOUP 60 is mounted, or is transmitted to the control device 100 through the transmitter 80. With this, the control device 100 can obtain information indicating a contamination state of an inside of the FOUP 60 detected by the FOUP 60.

As illustrated in FIG. 3(*b*), at four corners of a bottom portion of the FOUP 60, three gas supply ports 62 and one gas exhaust port 63 are provided. Within the embodiment, two of the gas supply ports 62 are arranged on a side opposite to the lid 61, and one of the gas supply ports 62 is arranged on a side of the lid 61. The gas exhaust port 63 is arranged on the side of the lid 61.

A gas supply source (not illustrated) for supplying a purge gas such as a $N_2$ gas is coupled to the gas supply port 62 through the air supply pipe 16 illustrated in FIG. 3 (*a*). An exhaust mechanism (not illustrated) is coupled to the gas exhaust port 63 through the exhaust pipe 17 so as to enable the $N_2$ gas supplied from the gas supply ports 62 to be exhausted.

A filter 18 for removing a particle and moisture is provided in the air supply pipe 16.

A porous body 64 extending inside the FOUP 60 in the vertical upward direction is provided in two gas supply ports 62 provided on a side opposite to the lid 61. The porous body 64 distributes the $N_2$ gas supplied from the gas supply port 62 equally among wafers.

A directional control check valve 19 is provided in the exhaust pipe 17 to prevent a gas from counterflowing into the FOUP 60 from the outside.

[Structure of FOUP Purge Apparatus]

Within the embodiment, the FOUP purge apparatus 20 has a structure similar to the load port LP, in which the partition wall 11 forming the loader module LM is omitted from FIG. 3. Further, the FOUP purge apparatus 20 conducts purging inside the FOUP 60 in response to an instruction from the control device 200.

[Structure of FOUP Stocker]

Figure 4:
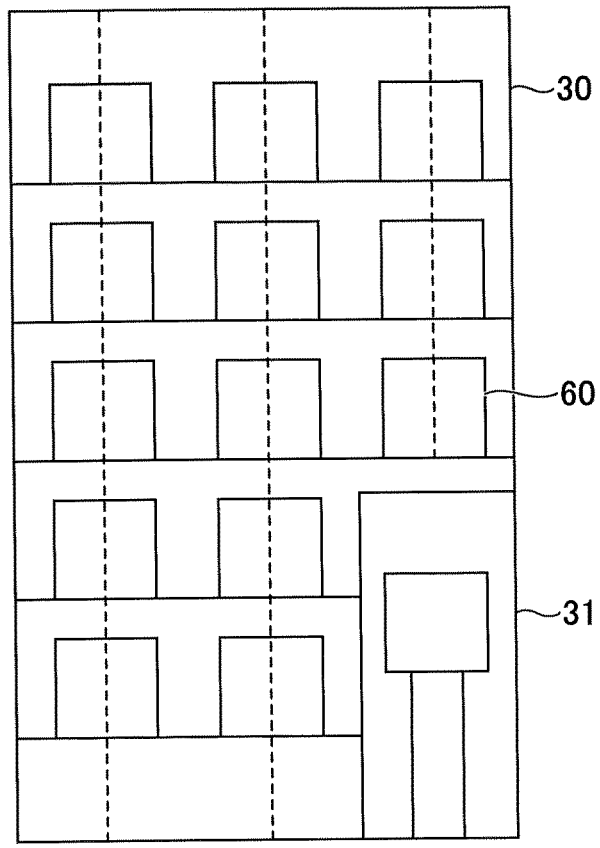
FIG. 4 illustrates an example of a structure of a FOUP stocker of the embodiment.

Referring to FIG. 4, an example of a structure of a FOUP stocker 30 of one embodiment of the present invention is described next. The FOUP stocker 30 having a FOUP carrying port 31 is a vault for temporarily storing the FOUP 60.

The FOUP stocker 30 may have a FOUP purging mechanism similar to that in the FOUP purge apparatus 20 at least one storage location. Further, the FOUP stocker 30 conducts purging inside the FOUP 60 in response to an instruction from the control device 300.

[Transfer of Wafer]

Referring to FIG. 2, transfer of the wafer W is described next. At first, the wafer W is carried out from any one of the FOUP 60 mounted on the load ports LP1 to LP3 and carried into any one of the substrate processing chambers PM1 to PM4. Specifically, the wafer W is carried out of the FOUP 60 mounted on any one of the load ports LP1 to LP3 and transferred into any one of the load locking chambers LLM1 and LLM2 through the loader module LM.

In any one of the load locking chambers LLM1 and LLM2 into which the wafer W is carried in, an exhaust process (evacuation to vacuum) is conducted in any one of the load locking chambers LLM1 and LLM2 into which the wafer W has been carried, and the inside the load locking chamber is switched from the air atmosphere to the vacuum atmosphere. In this state, the wafer W is carried out of any one of load locking chamber LLM1 and LLM2 by a transfer device VA, is carried into any one of substrate processing chambers PM1 to PM4, and the wafer W is processes in any one of the substrate processing chambers PM1 to PM4.

Described next is an example in which the wafer W is supplied to the substrate processing chamber PM1 and a plasma etching process is executed. Plasma is generated from a predetermined gas in the substrate processing chamber PM1 and the wafer W mounted on a mounting stage of the substrate processing chamber PM1 is subject to the plasma process. After the plasma process, the inside of the substrate processing chamber PM1 is purged by the $N_2$ gas.

Thereafter, the gate valve GV is opened, the processed wafer W is carried out and carried into the transfer chamber V. Further, the processed wafer W is carried into any one of the load locking chambers LLM1 and LLM2 by the transfer device VA. The inside of any one of the load locking chambers LLM1 and LLM2, from which the processed wafer is carried out, is switched from the vacuum atmosphere to the air atmosphere. Subsequently, the processed wafer W is carried into the FOUP 60 mounted on any one of the load ports LP1 to LP3 through the loader module LM.

At this time, inside the FOUP 60, there is a provability that a pre-process wafer W alters, a device formed on a wafer W has a defect, and a device property changes by an outgas from the processes wafer and a gas component diffused from the substrate processing chambers PM1 to PM4.

Within the embodiment, the outgas from the processed wafer and the gas component diffused from the substrate processing chambers PM1 to PM4 are measured by the QCM 70 to detect the abnormality inside the FOUP 60. In a case where necessary, a recovery process is executed. With this, it is possible to reduce an influence caused by the outgas from the wafer W.

[QCM]

Figure 5:
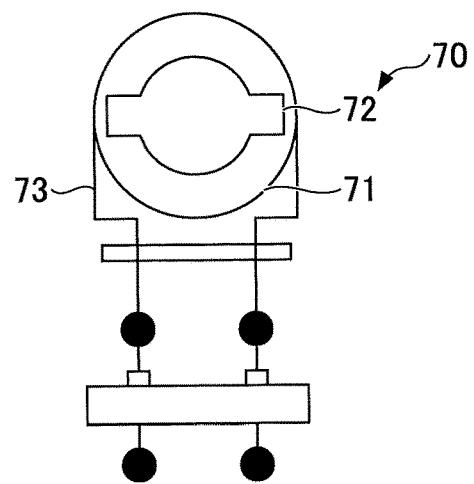
FIG. 5 illustrates an example of a structure of a QCM of the embodiment.

Referring to FIG. 5, QCM 70 is described briefly. The QCM 70 has a structure of supporting a crystal resonator, in which a quartz plate 71 is interposed between a pair of electrodes 72, using a supporter 73. When an extraneous material attaches to a surface of the crystal resonator, the resonant frequency f of the QCM 70 represented by the following formula 1 varies in response to the weight of the extraneous material.

$$f = 1/2t(\sqrt{C/\rho}),\qquad\text{[Formula 1]}$$

where t is the thickness of the quartz plate, C is the elastic constant, and $\rho$ is the density.

By using this phenomenon, minute attached matter can be quantitatively measured using a variation amount of the resonant frequency f. The variation of the resonant frequency f is determined by the variation of the elastic constant by the matter attached to the crystal resonator and the thickness obtained by converting the thickness of the attached matter to a crystal density. Thus, the variation of the resonant frequency f can be converted to the weight of the attached matter.

By using such a principal, the QCM 70 outputs a detection value indicating the resonant frequency f. For example, the control unit 101 converts the variation of the frequency to the weight of the attached mater based on the detection value output from the QCM 70 to calculate the film thickness or the deposition rate of the film. The resonant frequency f detected by QCM 70 is an example of information indicating a contamination state inside the FOUP 60.

The QCM 70 has monitor for a very small amount of attached matter using a crystal resonator and has a structure of providing electrodes respectively on both surfaces of a thin quartz plates. When the attached matter attaches onto the front surface of the QCM 70, the weight of the quartz plate increases to thereby slightly lower the frequency of oscillation. Therefore, a dedicated circuit monitors the lowered frequency of oscillation. Although the performance varies depending on the structure or the circuit of the quartz plate, it is possible to detect attaching of extraneous material of 1 ng or lighter. The QCM 70 is an extremely sensitive sensor.

Further, the important feature of the QCM 70 is that the QCM 70 does not directly measure a gas in an air space but measures what attached onto the surface of the QCM 70. Said differently, even if a gas is simply released from post-process wafer, as long as the released gas does not attach to and react with another wafer or the inner wall of the FOUP 60, no problem is caused. Therefore, the QCM 70 as an extraneous material attaching monitor is the most preferable sensor since there needs to monitor a gas directly influencing by attaching to, adsorbing to, and reacting with the wafer or the like inside the FOUP 60.

Figure 6:
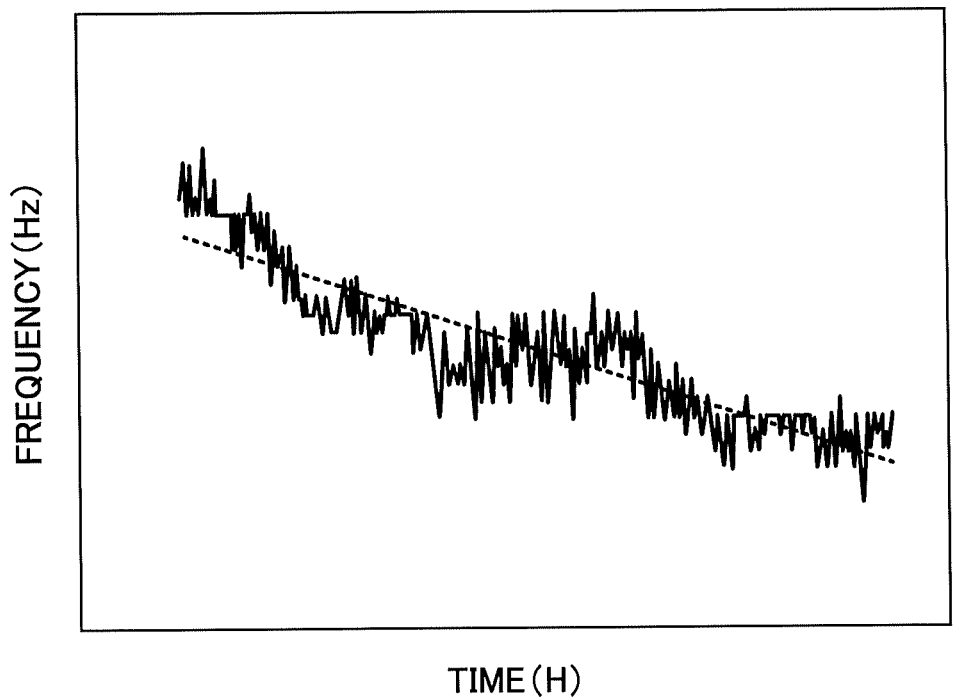
FIG. 6 illustrates an example of a frequency measured result of the QCM of the embodiment.

FIG. 6 illustrates a result of installing the QCM 70 in an etching apparatus and monitoring an outgas component from the wafer W. Referring to FIG. 6, the frequency linearly changes in response to lapse of time. Therefore, the QCM 70 can be used as a sensor.

Figure 7:
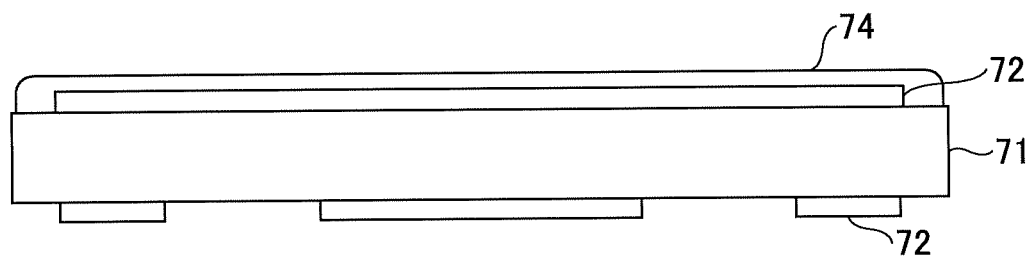
FIG. 7 illustrates an example of a surface state of the QCM of the embodiment.

Referring to FIG. 7, it is preferable to form a film 74 of coating any one of a resist, Si, $SiO_2$, or SiN on the front surface of the QCM 70. Further, the film 74 is preferably selected as a dominant film, which attaches at a time of processing the wafer W in the substrate processing chamber PM. As described, the QCM 70 is provided to measure the extraneous material attached to the surface. Therefore, by making a state of the front surface of the QCM 70 closer to a state of the front surface of the wafer W, the variation of the frequency can be highly accurately detected. The front surface of the QCM 70 is not necessarily coated by the resist, Si, $SiO_2$, or SiN.

If matter to be an outgas source exists in a narrow enclosed space, a component to be especially reattaching (tend to cause contamination) attaches onto the front surface of the QCM 70 so as to be measured as a weight change. When the amount of generating the outgas increases, the QCM 70 follows this increase to react.

Figure 8:
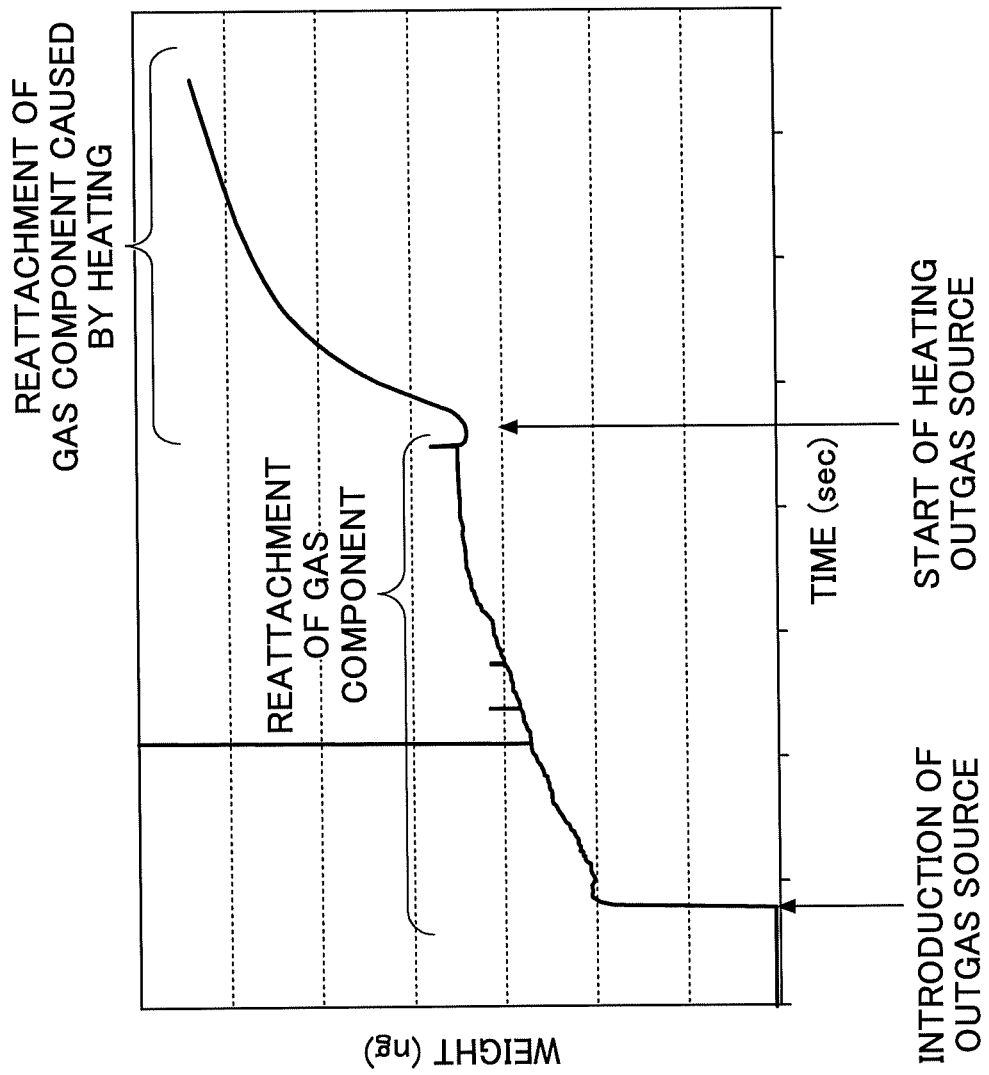
FIG. 8 illustrates an example of a weight measured result of the QCM of the embodiment.

Here, the QCM 70 is installed in a narrow enclosed space (piping) simulating the inside of the FOUP 60. Then, a result of monitoring the weight of the extraneous material attached onto the front surface of the QCM 70 is monitored. The result of monitoring the weight of the extraneous material is illustrated in FIG. 8. Referring to FIG. 8, it is known that the weight of the extraneous material attached on the front surface of the QCM 70 changes immediately after introducing the outgas source and immediately after heating the outgas source.

[Process of the Control Unit]

Then, the control devices 100, 200, 300, and 400 and the host computer 50 receives the frequency of the crystal resonator from the QCM 70 as an example of information indicating a contamination state.

The control unit 101 detects that abnormality exists inside the FOUP 60 in a case where the amount of change of frequency in the crystal resonator. The control unit 101 reports an error in a case where the abnormality inside the FOUP 60 is detected. The destination of reporting the error may be, for example, a monitor device for an operator, other control devices 100, 200, 300, and 400, the host computer 50.

If necessary, the control unit 101 performs the following recovery process in a case where the abnormality inside the FOUP 60 is detected.

Specifically, in the case where the abnormality inside the FOUP 60 is detected by the substrate processing apparatus 10, the control unit 101 can perform at least one of the following recovery processes. Hereinafter, the recovery process performed in a state where the FOUP 60 is installed inside the substrate processing apparatus 10 is referred to as a "recovery process at a time of docking".

(1) An inactive gas such as $N_2$ gas is introduced inside the FOUP 60.

(1-1) The flow rate of the inactive gas is controlled in response to a state of detecting the abnormality.

(1-2) The installation time of the inactive gas is controlled in response to the state of detecting the abnormality.

(2) The wafer W inside the FOUP 60 is transferred to any one of the substrate processing chambers PM1 to PM4, and the wafer W is processes again by a predetermined gas.

(3) The processing condition of the wafer W in the substrate processing chamber PM is changed The control unit 101 may perform any one of the following recovery processes in a case where the abnormality inside the FOUP 60 is detected outside the substrate processing apparatus 10. Hereinafter, a recovery process performed in a state where the FOUP 60 is installed outside the substrate processing apparatus 10 is referred to as a recovery process at a time of undocking.

(1) The FOUP 60 is transferred to the load port LP, the purge storage PS, the FOUP purge apparatus, or the FOUP stocker 30, and the inactive gas such as the $N_2$ gas is introduced inside the FOUP 60.

(2) The wafer W whose abnormality is detected inside the FOUP 60 is transferred to the purge storage PS or the FOUP stocker 30, and the wafer W transferred to the purge storage PS or the FOUP stocker 30 is held for a predetermined time.

Further, the control unit 101 may detect the abnormality inside the FOUP 60 based on the measured result based on the measured result of the QCM 70 again. In a case where the abnormality inside the FOUP 60 is detected again, the recovery process may be performed. In the recovery process, the wafer W in the FOUP 60 is transferred to any one of the substrate processing chambers PM1 to PM4 and the wafer W is processed again, or the processing condition of the wafer W in the substrate processing chamber PM is changed.

Further, the control unit 101 may detect the abnormality inside the FOUP 60 again based on the measured result of the QCM 70 after the recovery process is once performed. In a case where the abnormality inside the FOUP 60 is detected again, a pattern inspection for the wafer W inside the FOUP 60 may be performed by an apparatus inspecting a defect of the wafer W.

Further, the control unit 101 accumulates the measured result by the QCM 70 in a measured result table 103B of the RAM 103, and the above recovery process may be performed in a case where the abnormality inside the FOUP 60 is detected based on the measured result within the accumulated predetermined time.

[Real Time Recovery Process at Time of Docking]

Next, an example of the recovery process of the embodiment is described with reference to the flowchart illustrated in FIG. 9. This process is performed by the control unit 101 in, for example, a state where the FOUP 60 is installed in the load port LP of the substrate processing apparatus 10 and the wafer W is processed or transferred (at the time of docking).

After the process is started, the control unit 101 starts the measurement using the QCM 70 (the crystal resonator) installed in the FOUP (step S11). In a case where multiple QCMs 70 are installed in the FOUP 60, each of the multiple QCMs 70 starts the measurement.

Subsequently, the control unit 101 calculates the amount of change of frequency in the QCM 70 for a predetermined time (step S12). Here, the predetermined time is a time period for measuring measured values as many as several values to several tens of values most recently measured by the QCM 70.

Next, the control unit 101 determines whether the amount of change of frequency in the QCM 70 is greater than a predetermined first threshold value (step S13). The control unit 101 returns to step S11 and repeats the processes of steps S11 to S13 in a case where the amount of change of frequency is determined to be the first threshold value or smaller. The first threshold value is provided to detect the abnormality in the predetermined FOUP 60. If the amount of change of frequency is the first threshold value or greater, the abnormality is determined to exist in the FOUP 60.

If the amount of change of frequency in the QCM 70 is determined to be the first threshold value or greater, the control unit 101 reports an error (step S14). For example, the error is reported on a monitor device for the operator or the like.

Subsequently, the control unit 101 introduces the inactive gas such as the $N_2$ gas into the inside of the FOUP 60 using the load port LP in response to a purge time described in the processing condition table 103A illustrated in FIG. 11 (step S15).

In a state where the FOUP 60 is installed in the load port JP and the wafer W is processed, the lid 61 of the FOUP 60 is opened, so that the inactive gas introduced inside the FOUP 60 is exhausted from the lid 61. However, because the downflow is formed as described above, the substrate processing chamber is prevented from being contaminated.

Further, the control unit 101 extends a time of holding the wafer W in the purge storage PS in response to the purge storage holding time described in the processing condition table 103A illustrated in FIG. 11 (step S16). Either step S15 or step S16 may be performed.

Subsequently, the control unit 101 calculates the amount of change of frequency in the QCM 70 for a predetermined time (step S17). Here, the predetermined time is a predetermined time immediately closer to performing of step S12.

Next, the control unit 101 determines whether the amount of change of frequency in the QCM 70 is greater than the first threshold value (step S18). In a case where the control unit 101 determines that the amount of change of frequency in the QCM 70 is the first threshold value or smaller, the control unit 101 ends this process.

If the amount of change of frequency in the QCM 70 is determined to be greater than the first threshold value, the control unit 101 reports an error (step S19).

Subsequently, the control unit 101 causes the wafer W inside the FOUP 60 to be transferred into the purge storage PS, the wafer W is held by the purge storage PS or the wafer W inside the wafer W is transferred into any one of the substrate processing chambers PM1 to PM4. Then, cleaning is performed (step S20).

At this time, the wafer W is held by the purge storage PS in response to the purge storage holding time described in the processing condition table 103A illustrated in FIG. 11. Further, re-cleaning in the substrate processing chamber PM is performed in response to a time of dry cleaning (DC) described in the processing condition table 103A illustrated in FIG. 11.

Here, instead of the holding of the wafer W by the purge storage PS or the re-cleaning in the substrate processing chamber PM, ashing, heating of the wafer W, or surface treatment in a cleaning apparatus (not illustrated) can be performed as a post process for the wafer W. These processes are performed based on the processing condition described in the processing condition table 103A illustrated in FIG. 11.

Next, the control unit 101 updates various conditions of the processing condition table 103A illustrated in FIG. 11 based on the amount of change of frequency of the QCM 70 (step S21). Then, this process is ended. The updated processing condition table 103A is applied to the recovery process in the next cycle. Either step S20 or step S21 may be performed. The report of the error in steps S14 and S19 may not be performed.

As described, in a case where the abnormality is detected inside the FOUP 60 while the FOUP 60 is installed in the load port LP of the substrate processing apparatus 10 and the wafer W is processed, two stages of recovery processes are performed in real time to reduce the influence by the outgas from the processed wafer W.

[Real-Time Recovery Process at Time of Undocking]

Next, an example of the recovery process of the embodiment is described with reference to the flowchart illustrated in FIG. 10. This process is performed by the control unit 101 in a state (at a time of undocking) where the processes for the wafer W are completed and the FOUP 60 is present outside the substrate processing apparatus 10.

After this process is started, the control unit 101 starts measurement using the QCM 70 (the crystal resonator) installed in the FOUP 60 (step S31).

Subsequently, the control unit 101 calculates the amount of change of frequency in the QCM 70 for a predetermined time (step S32).

Next, the control unit 101 determines whether the amount of change of frequency in the QCM 70 is greater than a predetermined second threshold value (step S33). The control unit 101 returns to step S31 and repeats the processes of steps S31 to S33 in a case where the amount of change of frequency is determined to be the second threshold value or smaller. The second threshold value may be the same as or different from the first threshold value.

If the amount of change of frequency in the QCM 70 is determined to be greater than the second threshold value, the control unit 101 reports an error (step S34).

Subsequently, the control unit 101 sends a command to the control device 400 of the FOUP transferring apparatus 40 to transfer the FOUP 60 to any one of the substrate processing apparatus 10, the FOUP purge apparatus 20, and the FOUP stocker 30 (step S35).

Subsequently, the control unit 101 introduces the inactive gas such as the $N_2$ gas into the inside of the FOUP 60 using the load port LP or a FOUP purge apparatus in response to a purge time described in the processing condition table 103A illustrated in FIG. 11 (step S36).

In a case where the FOUP 60 is transferred by the substrate processing apparatus 10, the control unit 101 holds the wafer W inside the purge storage PS in response to the purge storage holding time described in the processing condition table 103A illustrated in FIG. 11 (step S37). Either step S36 or step S37 may be performed.

Subsequently, the control unit 101 calculates the amount of change of frequency in the QCM 70 for a predetermined time (step S38).

Next, the control unit 101 determines whether the amount of change of frequency in the QCM 70 is greater than the second threshold value (step S39). In a case where the control unit 101 determines that ˆthe amount of change of frequency in the QCM 70 is the second threshold value or smaller, the control unit 101 ends this process.

If the amount of change of frequency in the QCM 70 is determined to be greater than the second threshold value, the control unit 101 reports an error (step S40).

Subsequently, the control unit 101 transfers the wafer W inside the FOUP 60 to any one of the substrate processing chambers PM1 to PM4 to conduct the re-cleaning or a pattern inspection for the wafer W inside the FOUP 60 by an apparatus for checking a defect of the wafer (step S41).

At this time, the re-cleaning in the substrate processing chamber PM is performed in response to a time of dry cleaning (DC) described in the processing condition table 103A illustrated in FIG. 11.

Here, instead of the re-cleaning in the substrate processing chamber PM, ashing, heating of the wafer W, or surface treatment in a cleaning apparatus (not illustrated) can be performed as a post process for the wafer W. These processes are performed based on the processing condition described in the processing condition table 103A illustrated in FIG. 11.

Next, the control unit 101 updates various conditions of the processing condition table 103A illustrated in FIG. 11 based on the amount of change of frequency of the QCM 70 (step S42). Then, this process is ended. One or both of the re-cleaning and the pattern inspection may be performed.

As described, in a case where the process for the wafer ends and the abnormality is detected inside the FOUP 60 while the FOUP 60 is separated from the substrate processing apparatus 10, two stages of recovery processes are performed in real time to reduce the influence by the outgas from the processed wafer W. However, the recovery process may have one stage or at least three stages.

The processing condition table 103A is a table in which the processing condition such as the purge storage holding time 103A is set. The processing condition table 103A may be stored inside the control device 100, the host computer 50, or a cloud computer coupled to the control device 100 through the network.

[Accumulating Process for Accumulating Measured Results Obtained by QCM]

Next, an example of an accumulating process of the measured result of the embodiment is described with reference to a flowchart illustrated in FIG. 12. This process is performed by the control unit 101 by receiving the measured result obtained by the QCM 70 sent from the transmitter 80 installed in the FOUP 60.

After this process is started, the control unit 101 starts measurement using the QCM 70 installed in the FOUP 60 (step S51).

Subsequently, the control unit 101 accumulates the measured result obtained by the QCM 70 into a measured result table 103B in the RAM 103 (step S52). Then, the process ends.

Figure 10:
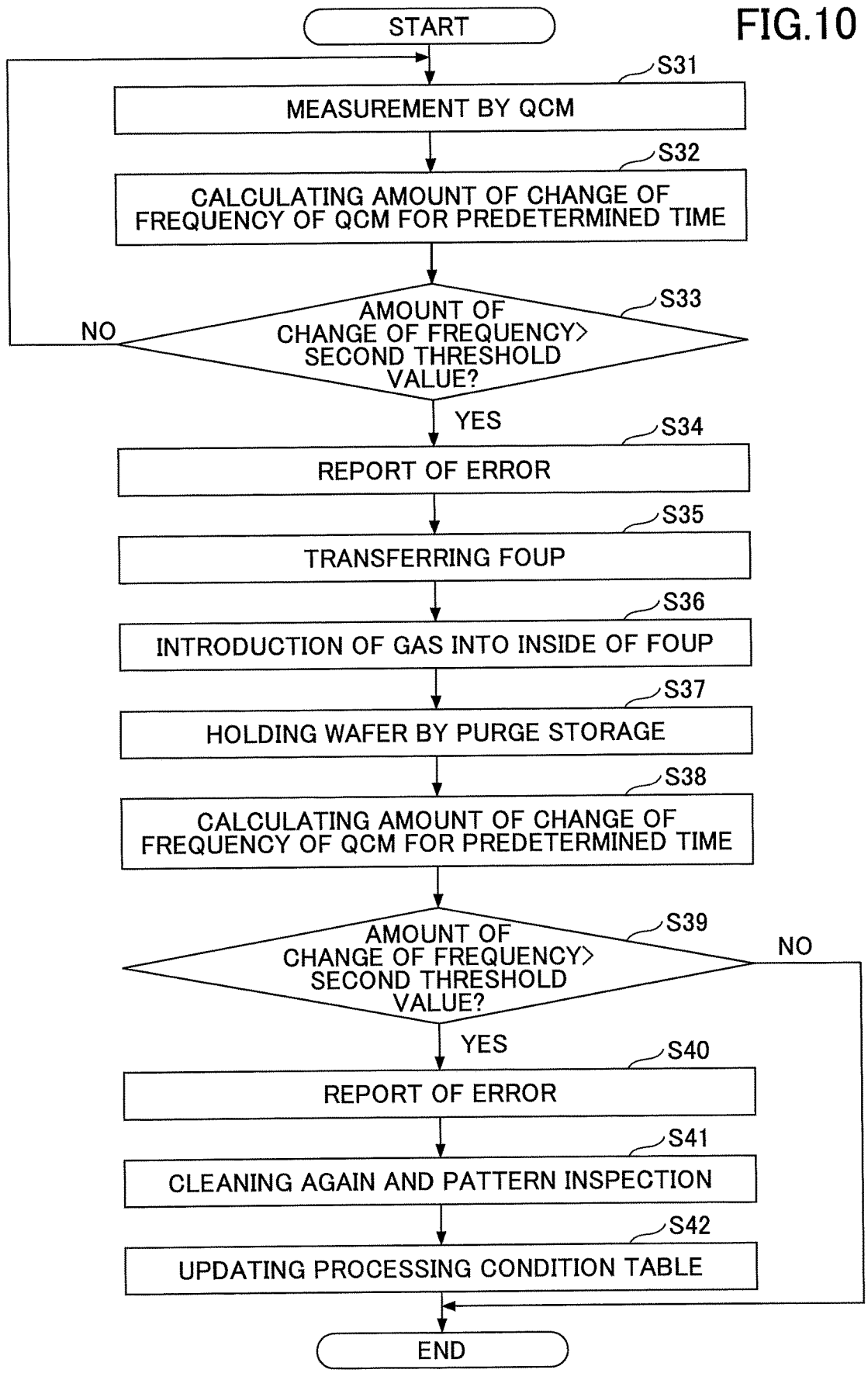
FIG. 10 is a flowchart illustrating an example of the recovery process of the embodiment.
Figure 12:
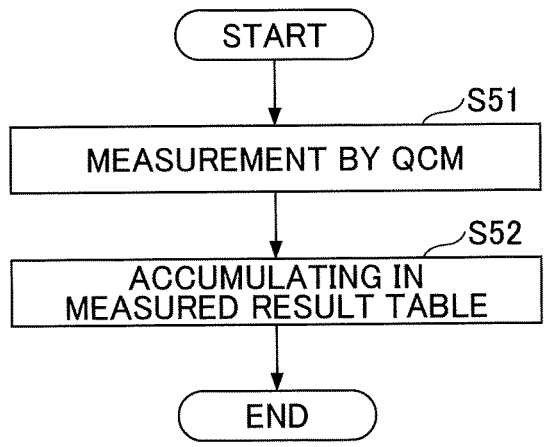
FIG. 12 is a flowchart illustrating an example of an accumulating process of a measured result of the embodiment.

The above measured result obtained by the QCM 70 may be accumulated at a timing different from a process of abnormality detection as illustrated in FIG. 12 or may be accumulated in the measured result table 103B at a time of the measurement by the QCM and the process of the abnormality detection illustrated in FIG. 10.

Frequencies in response to a passage of a predetermined time illustrated in FIG. 6 may be accumulated in the measured result table 103B. The measured result table 103B may be stored inside the control device 100, the host computer 50, or a cloud computer coupled to the control device 100 through the network.

[Non-Realtime Recovery Process Based on Accumulated Measured Result Obtained by QCM]

Figure 13:
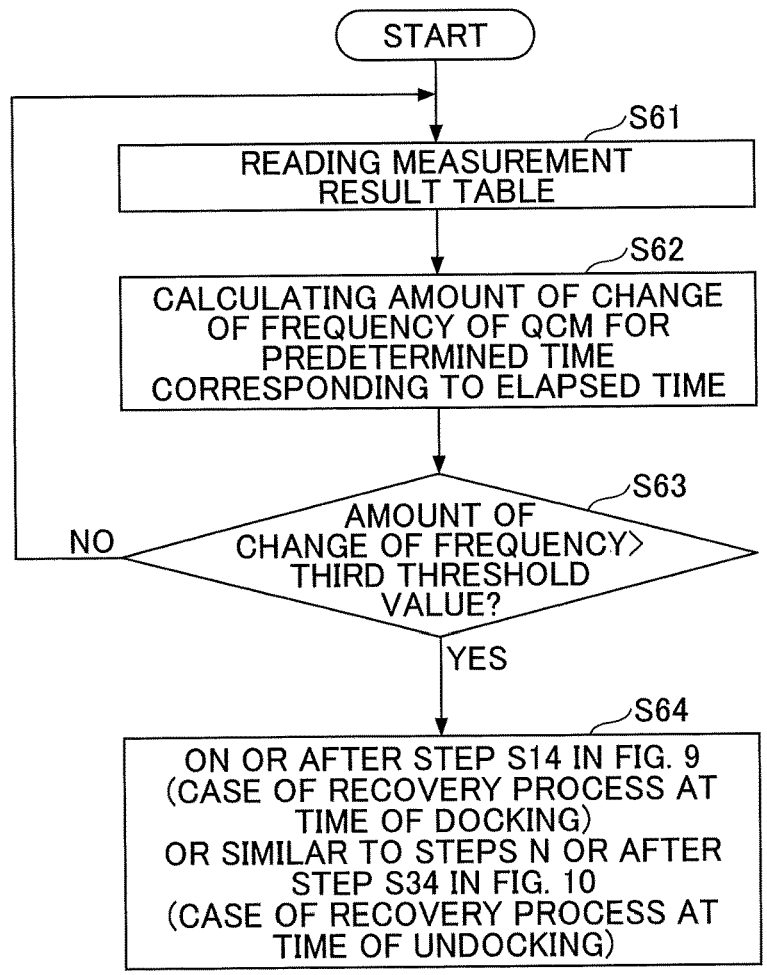
FIG. 13 is a flowchart illustrating an example of a recovery process of the embodiment.

Next, an example of the recovery process of the embodiment is described with reference to the flowchart illustrated in FIG. 13. This process is performed by the control unit 101 in, for example, a state where the FOUP 60 is installed in the load port LP of the substrate processing apparatus 10 and the wafer W is processed or transferred (at the time of docking).

After this process has been started, the control unit 101 reads the measured result table 103B stored in the RAM 103 (step S61).

Subsequently, the control unit 101 calculates the amount of change of frequency in the QCM 70 based on the measured result table 103B in response to calculating amount of change of frequency of QCM for a predetermined time corresponding to an elapsed time (step S62). Here, the predetermined time may be the predetermined time corresponding to the information of the measured result table which is one lot earlier than the current lot or the information of the measured result table which is several lots earlier than the current lot 103B.

Next, the control unit 101 determines whether the amount of change of frequency in the QCM 70 is greater than a predetermined third threshold value (step S63). The third threshold value may be the same as or different from the first or second threshold value.

Figure 9:
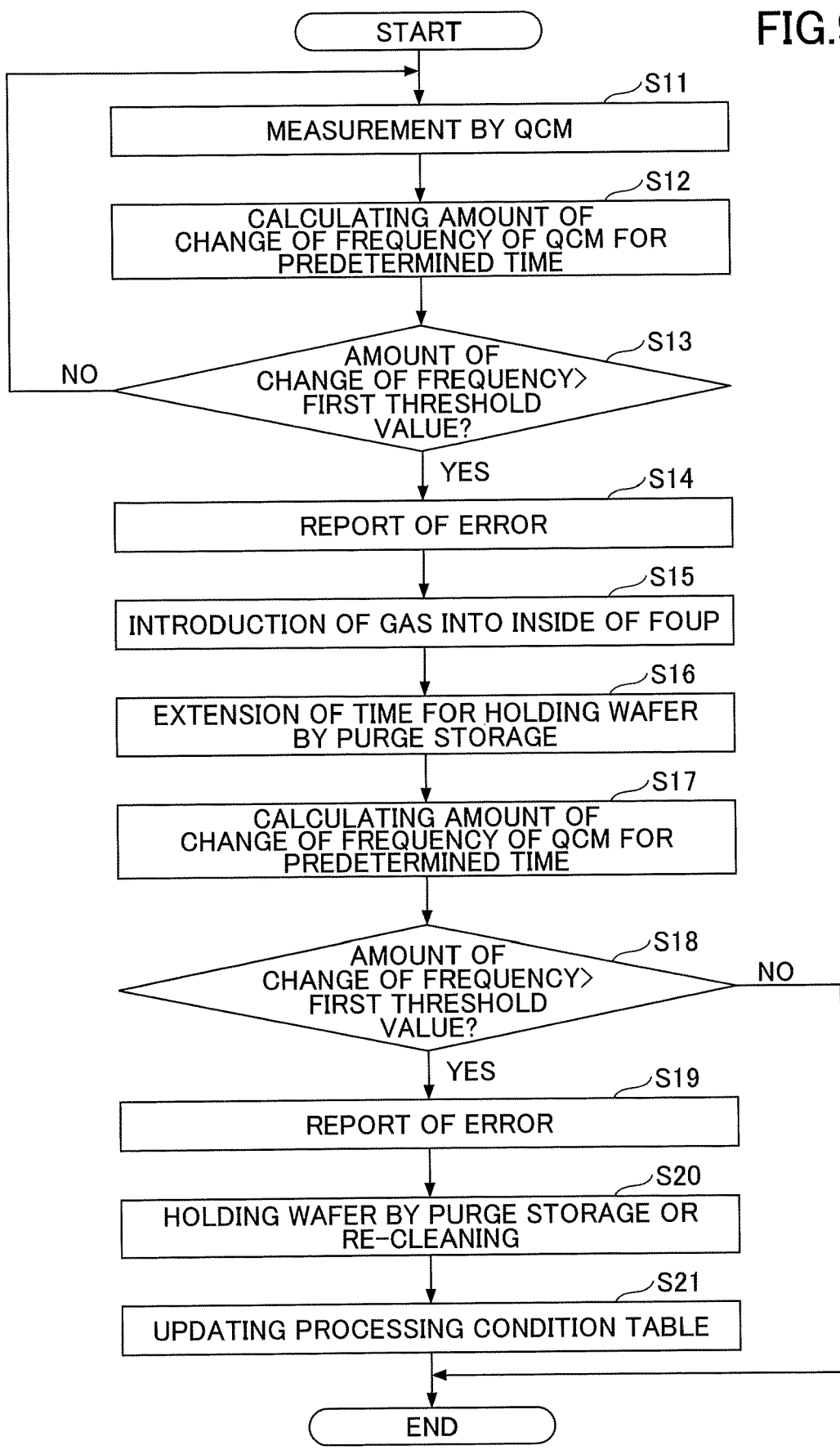
FIG. 9 is a flowchart illustrating an example of the recovery process of the embodiment.

Because the process on and after this is similar to a part of the flowchart on and after step S14 (a case of a recovery process at a time of docking) in FIG. 9 or a part of the flowchart on and after step S34 (a case of a recovery process at a time of undocking) in FIG. 10, description thereof is omitted (step S64).

As such, the control unit 101 accumulates the measured result by the QCM 70 in the measured result table 103B of the RAM 103, and detects the abnormality inside the FOUP 60 based on the measured result within the accumulated predetermined time. In this case, the recovery process is performed in non-real time to enable to know a contamination state inside the FOUP 60 for a long time so that an influence of the outgas coming from the processed wafer W.

As described above, according to the FOUP 60 of the embodiment, the FOUP 60 accommodates the wafer W, the QCM 70 for detecting the contamination state is installed inside the FOUP 60 to provide the FOUP 60 enabled to detect the contamination state inside the FOUP 60. Therefore, the contamination state inside the FOUP 60 can be detected.

Further, according to the control device of the embodiment, the information indicating the contamination state inside the FOUP 60 detected by the QCM 70 installed inside the FOUP accommodating the wafer W is obtained, and the abnormality inside the FOUP 60 is detected based on the obtained information. In a case where the abnormality inside the FOUP 60 is detected, the recovery process is performed. With this, it is possible to reduce an influence caused by the outgas coming from the processed wafer W.

All examples and conditional language recited herein are intended for pedagogical purposes to aid the reader in understanding the invention embodiments and the concepts contributed by the inventor to furthering the art, and are to be construed as being without limitation to such specifically recited examples and conditions, nor does the organization of such examples in the specification relate to a showing of superiority or inferiority of the invention embodiments. Although the substrate accommodating container, the control device, and the abnormality detection method of the present invention have been described in detail, it should be understood that the various changes, substitutions, and alterations could be made hereto without departing from the spirit and scope of the invention.

The features described in the above multiple embodiments may be combined so as not to contradict one another.

For example, the monitor installed in the FOUP is not limited to the QCM. A sensor other than the QCM may be used. Another example of the monitor is a capacitance-type sensor. In the capacitance-type sensor, the amount of sediment of the reaction product can be measured by measuring the capacitance.

Further, the control unit calculates the amount of change of frequency (rate of change) within a short time immediately after carrying the wafer into the FOUP. In a case where the rate of change is higher than a predetermined threshold value, the wafer may be re-cleaned as the influence of the outgas caused by the wafer that is carried in is high.

The substrate processing apparatus may be not only a capacitively coupled plasma (CCP) apparatus but also other apparatus. The other apparatus is an plasma apparatus of an inductively-coupled type (inductively coupled plasma: ICP), a plasma process apparatus using a radial line slot antenna, a plasma apparatus of a helicon wave excitation type (helicon wave plasma: HWP), a plasma apparatus of an electron cyclotron resonance (electron cyclotron resonance plasma: ECR), or the like. Alternatively, the other apparatus may be a plasmaless apparatus performing etching or a deposition process using a reactive gas and heat.

Although the wafer has been described, the wafer may be replaced by various boards used for a liquid crystal display (LCD), a flat panel display (FPD), and so on, photomask, a compact disc (CD) board, a printed wiring board, or the like.

According to an aspect of the embodiment, the contamination state inside the substrate accommodating container is detectable.

What is claimed is:

1. A substrate processing system comprising:
 a loader module configured to transfer a substrate under an air atmosphere;
 a load port connected to the loader module;
 a substrate container mounted on the load port;
 a monitor configured to detect a contamination state inside the substrate container;
 a vacuum transfer chamber configured to transfer the substrate under a vacuum atmosphere;
 a load lock chamber disposed between the loader module and the vacuum transfer chamber;
 a plurality of substrate processing chambers connected to the vacuum transfer chamber
 a controller configured to
 process the substrate in one of the plurality of substrate processing chambers,
 transfer the processed substrate to the substrate container through the vacuum transfer chamber, the load lock chamber, and the loader module,
 detect a contamination state inside the substrate container by the monitor, and
 perform a recovery process based on the detected contamination state,
 wherein the recovery process includes transferring the processed substrate disposed inside the substrate container to any one of the plurality of substrate processing chambers through the loader module, the load lock chamber, and the vacuum transfer chamber, and cleaning the processed substrate.

2. The substrate processing system according to claim 1, wherein the controller performs a report of error in a case where an abnormality is detected.

3. The substrate processing system according to claim 2, wherein the controller performs, in a case where the abnormality inside the substrate container is detected outside the substrate processing apparatus, the recovery process by either transferring the substrate container, in which the abnormality is detected, to the load port, a purge storage, the substrate container, a Front Opening Unified Pod (FOUP) purge apparatus, or a FOUP and introducing an inert gas into an inside of the load port, the purge storage, the substrate container, the FOUP purge apparatus, or the FOUP stocker, or transferring the substrate inside the substrate container, in which the abnormality is detected, to the FOUP purge storage or the FOUP stocker and holding the transferred substrate in the purge storage or the FOUP stocker.

4. The substrate processing system according to claim 2, wherein the controller performs another recovery process including detecting the abnormality inside the substrate container again based on the information acquired after the recovery process as indicating the contamination state, and processing the substrate in the substrate processing chamber using a predetermined gas or changing a processing condition for the substrate in the substrate processing chamber in a case where the abnormality is detected again.

5. The substrate processing system according to claim 1, wherein the controller performs the recovery process in a case where an abnormality is detected.

6. The substrate processing system according to claim 5, wherein the controller performs detecting the abnormality inside the substrate container again based on the information indicating the contamination state acquired after the recovery process, and conducting a pattern inspection for the substrate inside the substrate container using an apparatus of inspecting a defect of the substrate in a case where the abnormality is detected again.

7. The substrate processing system according to claim 1, wherein the controller performs the recovery process in a case where an abnormality inside the substrate container is detected based on information indicating the contamination state during an accumulated predetermined time by referring to a memory unit, in which the information indicating the contamination state is accumulated.

8. The substrate processing system according to claim 1, wherein the monitor is a crystal resonator.

9. The substrate processing system according to claim 8, wherein any one of a resist, Si, $SiO_2$, and SiN is coated on a surface of the crystal resonator.

10. The substrate processing system according to claim 1, wherein the monitor is installed on at least any one of an inner upper surface, an inner lower surface, or an inner side surface inside the substrate container in response to a type of a predetermined gas used to process the substrate in the substrate processing chamber.

11. A substrate processing system comprising:
a loader module configured to transfer a substrate under an air atmosphere;
a load port connected to the loader module;
a substrate container mounted on the load port;
a monitor configured to detect a contamination state inside the substrate container;
a vacuum transfer chamber configured to transfer the substrate under a vacuum atmosphere;
a load lock chamber disposed between the loader module and the vacuum transfer chamber;
a plurality of substrate processing chambers that are connected to the vacuum transfer chamber; and
a controller configured to
process the substrate in one of the plurality of substrate processing chambers,
transfer the processed substrate to the substrate container through the vacuum transfer chamber, the load lock chamber, and the loader module,
detect a contamination state inside the substrate container by the monitor, and
perform a recovery process based on the detected contamination state,
wherein the recovery process changes a processing condition of the plurality of substrate processing chambers.

12. The substrate processing system according to claim 11, wherein the controller performs a report of error in a case where an abnormality is detected.

13. The substrate processing system according to claim 12, wherein the controller performs, in a case where the abnormality inside the substrate container is detected outside the substrate processing apparatus, the recovery process by either transferring the substrate container, in which the abnormality is detected, to the load port, a purge storage, the substrate container, a FOUP purge apparatus, or a FOUP stocker and introducing an inert gas into an inside of the load port, the purge storage, the substrate container, the FOUP purge apparatus, or the FOUP stocker, or transferring the substrate inside the substrate container, in which the abnormality is detected, to the FOUP purge storage or the FOUP stocker and holding the transferred substrate in the purge storage or the FOUP stocker.

14. The substrate processing system according to claim 12, wherein the controller performs another recovery process including detecting the abnormality inside the substrate container again based on the information acquired after the recovery process as indicating the contamination state, and processing the substrate in the substrate processing chamber using a predetermined gas or changing a processing condition for the substrate in the substrate processing chamber in a case where the abnormality is detected auain.

15. The substrate processing system according to claim 11, wherein the controller performs the recovery process in a case where an abnormality is detected.

16. The substrate processing system according to claim 15, wherein the controller performs detecting the abnormality inside the substrate container again based on the information indicating the contamination state acquired after the recovery process, and conducting a pattern inspection for the substrate inside the substrate container using an apparatus of inspecting a defect of the substrate in a case where the abnormality is detected again.

17. The substrate processing system according to claim 11,
wherein the controller performs the recovery process in a case where an abnormality inside the substrate container is detected based on information indicating the contamination state during an accumulated predetermined time by referring to a memory unit, in which the information indicating the contamination state is accumulated.

18. The substrate processing system according to claim 11,
wherein the monitor is a crystal resonator.

19. The substrate processing system according to claim 18,
wherein any one of a resist, Si, $SiO_2$, and SiN is coated on a surface of the crystal resonator.

20. The substrate processing system according to claim 11,
wherein the monitor is installed on at least any one of an inner upper surface, an inner lower surface, or an inner side surface inside the substrate container in response to a type of a predetermined gas used to process the substrate in the substrate processing chamber.

* * * * *